United States Patent [19]

Tai et al.

[11] Patent Number: 5,021,994
[45] Date of Patent: Jun. 4, 1991

[54] LOOK-AHEAD FLAG GENERATOR

[75] Inventors: Jy-Der Tai, Plano; Edison Chiu, Richardson; Quang-Dieu An, Dallas; Te-Chuan Hsu, Arlington, all of Tex.

[73] Assignee: Texas Instruments Incorporated, Dallas, Tex.

[21] Appl. No.: 142,374

[22] Filed: Jan. 11, 1988

[51] Int. Cl.$^5$ .................. G06F 12/00; G11C 7/00
[52] U.S. Cl. .................. 364/900; 364/960;
364/960.2; 364/960.4; 364/960.6; 364/965.4;
364/971; 365/220
[58] Field of Search ............ 364/200, 900, 410, 731,
364/420, 523; 455/158; 365/221

[56] References Cited

U.S. PATENT DOCUMENTS

| 4,486,854 | 12/1984 | Yuni | 364/900 |
| 4,516,201 | 5/1985 | Warren et al. | 364/200 |
| 4,815,039 | 3/1989 | Tai et al. | 365/189 |
| 4,829,475 | 5/1989 | Ward et al. | 365/78 |
| 4,835,738 | 5/1989 | Niehaus et al. | 364/900 |
| 4,864,543 | 9/1989 | Ward et al. | 365/221 |
| 4,933,901 | 6/1990 | Tai et al. | 365/189.07 |

Primary Examiner—Gareth D. Shaw
Assistant Examiner—Matthew C. Fagan
Attorney, Agent, or Firm—Ronald O. Neerings; Thomas W. DeMond; Melvin Sharp

[57] ABSTRACT

A look-ahead flag generator generates a flag signal corresponding to the occurrence of a predetermined value stored in a counter (10). The output of the counter outputs any of a plurality of values, the values including the predetermined value and at least one boundary value that is one unit of increment or decrement displaced from the predetermined value. A clock signal source (13) is coupled to a first input of the counter (10) to indicate a decrement or an increment to the value stored in the counter (10). An up/down signal source (11) is coupled to a second input of the counter to indicate whether an increment or a decrement of the stored value should be performed. Predetermined states of the up/down signal and the clock signal are operable to cause a boundary value stored in the counter (10) to be changed to the predetermined value. A predecoder (12) is coupled to an output of counter (10) for decoding the boundary value. A latch (132) stores the decoded boundary value. A gate circuit (111, 117, 139) is coupled to the latch (132), a flag signal output, the up/down signal source (11) and the clock signal source (13) and is operable to generate the flag signal in response to the stored decoded boundary value and the predetermined states of the up/down signal and the clock signal.

11 Claims, 3 Drawing Sheets

LOOK-AHEAD FLAG GENERATOR

TECHNICAL FIELD OF THE INVENTION

The present invention relates in general to flag generators for sequential memories and more particularly discloses a look-ahead flag generator for application to a FIFO memory.

BACKGROUND OF THE INVENTION

Conventional first-in, first-out (FIFO) memories are equipped with status flag generators that generate status flags responsive to predetermined portions of the capacity of the memory being used. These flags, for example, may include an EMPTY flag to indicate that the associated FIFO memory is empty, a FULL flag to indicate that the FIFO memory is full, and other flags to indicate intermediate conditions. The EMPTY flag is often used to disable further reading of data from the FIFO memory, and the FULL flag is often used to disable further writing of data into the FIFO memory.

In the application of this invention, the FIFO is designed to use an up/down counter to determine the difference between the values stored in a write counter of the FIFO memory and in a read counter thereof. The write counter indicates the address of the FIFO memory into which data is to be written, and the read counter indicates the address in the FIFO from which data is to be read. The up/down counter keeps a record of the difference between the write counter and the read counter, thereby recording the amount of capacity being used in the FIFO. This up/down counter is used to generate any of a selected number of status flags.

A traditional method of using the output of the up/down counter to generate status flags is to decode the outputs through several stages of decoding gates. As the size of the up/down counter increases, the delay experienced in decoding the state of the up/down counter increases. A need has therefore arisen for a flag generator that can generate a status flag from an up/down counter with less delay.

SUMMARY OF THE INVENTION

According to one aspect of the invention, a look-ahead flag generator is provided for generating a flag signal corresponding to the occurrence of a predetermined value in a counter. The counter includes an output for outputting any of a plurality of values, the values including the predetermined value and at least one boundary value that is displaced by one unit of increment or decrement from the predetermined value. A control signal source is coupled to the counter for changing a stored boundary value to the predetermined value. A predecoder is coupled to the output of the counter for decoding the boundary value. A latch for storing the decoded boundary value is coupled to a gate circuit. The gate circuit is further coupled to a flag signal output, the up/down signal source, and the control signal source. The gate circuit operates to generate the flag signal in response to the stored decoded boundary value and the control signals. This is the look-ahead operation.

Preferably, the control signals include an up/down signal for indicating whether an increment or a decrement to the value stored in the counter is to be performed, and a clock signal for actuating this increment or decrement. The gate circuit generates a flag signal in response to predetermined states of these signals and a particular boundary value.

According to another aspect of the invention, a preload decoder may be provided for decoding the predetermined value from a value data source. A preload gate circuit receives the decoded predetermined value and a preload signal, and is coupled to the flag signal output for generating the flag signal responsive to the decoded predetermined value and the preload signal.

A principal advantage is provided by the invention in that the counter is incremented or decremented with the same clock signal that actuates the generation of the status flag. There is therefore no delay in between these two operations, which conventionally can amount to at least three gate delays for a nine-bit up/down counter. Another advantage is provided by the provision of the preload decoder. Since in normal operation the status flag will not be generated without the previous occurrence of a boundary value, the preload decoder was used to actuate the status flag in instances where no boundary value was pregenerated This can happen, for example, responsive to a retransmit signal sent from a read apparatus coupled to the sequential memory.

BRIEF DESCRIPTION OF THE DRAWINGS

Further aspects of the invention and their advantages can be ascertained with reference to the following detailed description in conjunction with the drawings, in which.

DETAILED DESCRIPTION

FIFO Flag Generating Circuitry

Figure 1:
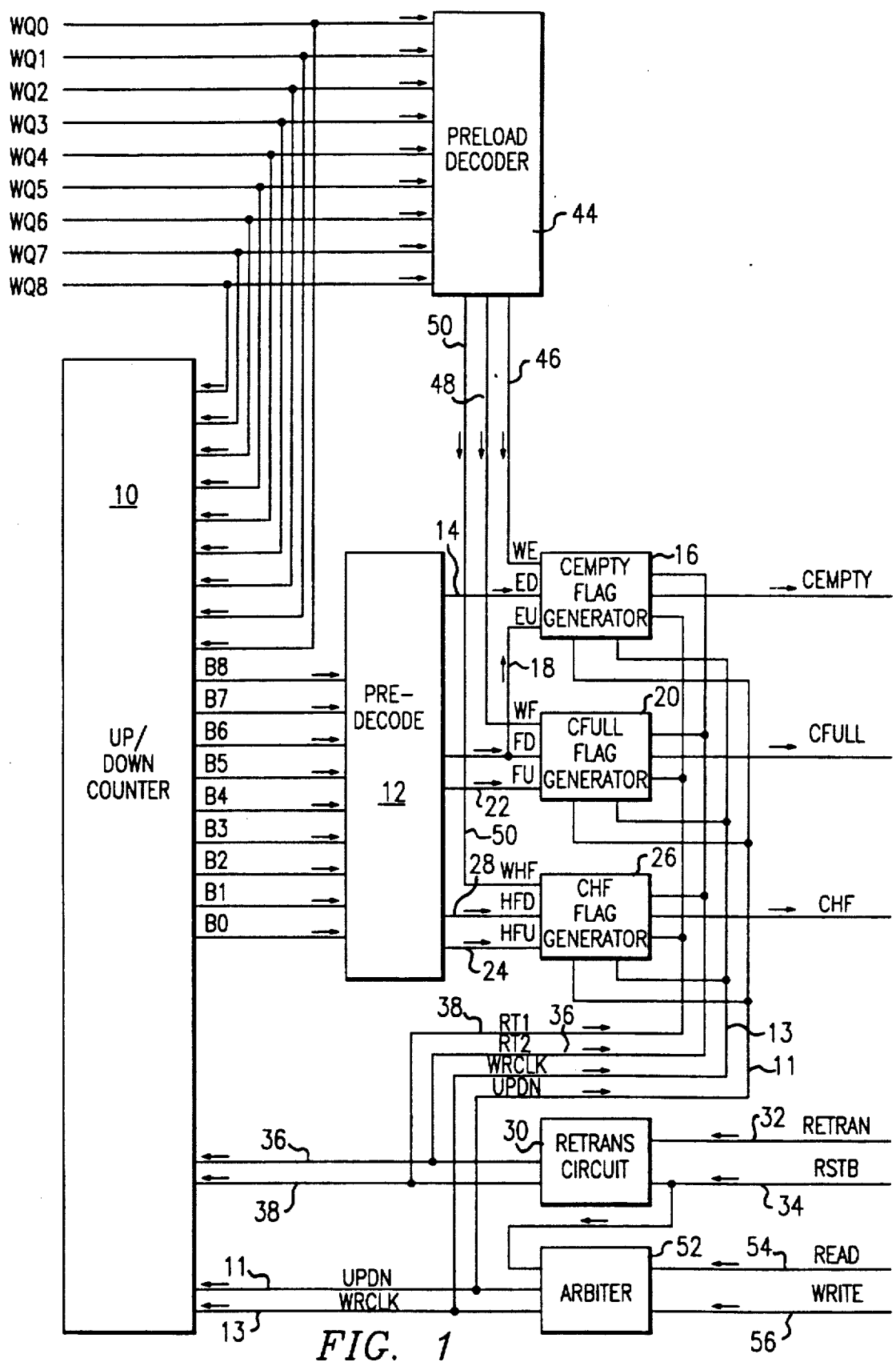
FIG. 1 is a schematic electrical block diagram showing up/down counter, preload and flag generation circuitry according to the invention.
Figure 3:
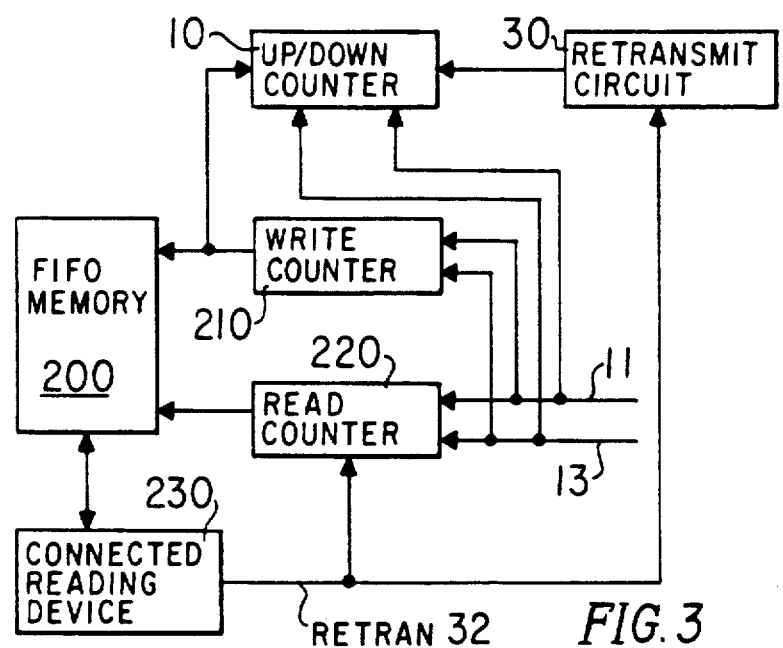
FIG. 3 is a schematic block diagram showing the FIFO memory, read counter, write counter, and up/down counter.

FIG. 1 is a schematic electrical block diagram of internal flag-generating circuitry according to the invention. This internal flag generating circuitry includes an up/down counter 10 which receives as inputs a plurality of lines WQ0-WQ8 from a write counter 210 in FIG. 3 This write counter, which for example may be a 9-bit binary counter, determines the address location into which data will next be written within an associated FIFO memory 200. A read counter 220 is provided to determine the location in the FIFO memory from which data is to be read.

Up/down counter 10 records the difference between the read counter and the write counter responsive to signals on input lines 11 and 13. A bivalent signal is input on UPDN or read/write signal line 11 into up/down counter 10. In the illustrated embodiment, a high value of UPDN indicates a write request, and a low value thereof indicates a read request. Line 13 (WRCLK) supplies a clock pulse that indicates the present occurrence of either a write request or a read request, depending on the current value of line 11.

Up/down counter 10 is operable to output a multi-bit signal on lines B0-B8 that indicates how much capacity of the FIFO memory is being used. For example, where the FIFO memory is empty, the signals on lines B0–B8 will all be logic zeros.

Lines B0–BS are output from up/down counter 10 to a predecoder 12 that is operable to decode each of a plurality of boundary values that are in turn used for the generation of a plurality of boundary signals. In the illustrated embodiment, an "empty down" or ED signal is generated on a line 14 from predecoder 12 and is input into a CEMPTY flag generator 16. An "empty up" or EU signal is generated on an output line 18 and is input into CEMPTY flag generator 16 and also into a CFULL flag generator 20. A "full up" (FU) signal is output on a line 22 and is input into CFULL flag generator 20. In this application, FD or "full down" happens to be the same as EU or "empty up". A "half full up" (HFU) signal is output on a line 24 and is input into a CHF flag generator 26. Finally, a "half full down" (HFD) signal is output from predecoder 12 on a line 28 to CHF flag generator 26.

Each of the signals ED, EU, FU, HFD and HFU are generated responsive to a certain value appearing on input signals B0–B8. For example, the "ED" signal is generated responsive to lines B0–B8 inputting 000000010. This corresponds to the FIFO memory being in the condition EMPTY +2, or where only two cells in the memory contain data. A signal is output on EU line 18 when input lines B0–BB input 000000000, corresponding to a completely EMPTY condition of the FIFO. The ED signal on line 14 and the EU on line 18 are input into flag generator 16 to generate a CEMPTY flag that will be generated when the FIFO memory is in an EMPTY +1 condition.

An FU signal is generated on output line 22 when B0–B8 input 111111110, indicating an ALMOST FULL −1 condition in the FIFO. Flag generator 20 generates the CFULL internal flag when the FIFO memory is exactly 111111111, indicating an ALMOST FULL condition. Therefore, the other boundary condition used to generate this flag is an FD signal on line 18, corresponding to a completely FULL memory.

The HFD signal on line 28 goes high responsive to lines B0–B8 inputting 100000001, corresponding to a HALF FULL +1 condition in the FIFO. The HFU signal on line 24 goes high responsive to B0–B8 inputting 011111111, corresponding to a HALF FULL −1 condition in the FIFO. The HFD and HFU boundary signals are used by flag generator 26 to generate the CHF flag when the memory is exactly HALF FULL.

UPDN line 11 and clock line 13 are connected to each of flag generators 16, 20, and 26. Flag generators 16, 20, and 26 each use the signals on these lines to set the flags on the respective CEMPTY, CHF, and CFULL lines.

A retransmit circuit 30 receives., a retransmit signal RETRAN on a line 32 and a master reset signal RSTB on line 34. Responsive to the receipt of a high RETRAN signal on line 32, retransmit circuit 30 will first generate a reset signal on an RT1 output line 38, and after a predetermined delay will generate a pulse on an RT2 output line 36. RT1 and RT2 lines 38 and 36 are connected to up/down counter 10, CHF flag generator 26, CFULL flag generator 20, and CEMPTY flag generator 16. Responsive to a high signal on master reset line 3⁴, retransmit circuit 30 will only generate a high signal on RT1 line 38.

The RETRAN signal is sent into the FIFO from a connected reading device 230 so that the data just transmitted can be transmitted again. This can happen where the first transmission of the data was garbled or where it is desired to fetch the data several times in sequence. As above noted, up/down counter 10 is operable to store the difference between the write counter and the read counter, thus giving a measure of how full the FIFO memory is.

The RETRAN signal input on line 32 is also used to reset the read counter 220 to 0. After a RETRAN signal, the data will be read from the FIFO 200 from its 0 location sequentially upward until empty.

Up/down counter 10 increments or decrements according to the signals received on up/down input line 11 and read/write clock (WRCLK) input line 13. When WRCLK line 13 is high and the UPDN signal on line 11 is high, the up/down counter 10 will increment by 1. If the clock signal on WRCLK line 13 is high and the UPDN signal is low, the up/down counter will decrement by 1. In this manner, the difference between the write counter 210 and the read counter 220 is kept track of. The difference is stored in binary form in a plurality of flip flops (not shown) internal to up/down counter 10.

When the read counter is reset to zero responsive to a RETRAN signal, the actual difference between the value of the read counter and the value of the write counter will not be correctly represented in up/down counter 10. Therefore, responsive to a RETRAN signal, retransmit circuit 30 will generate a high pulse on an RT1 line 38. RT1 line 38 acts to reset each of the flip flops (not shown) within up/down counter 10 to zero. Shortly thereafter, a high pulse on an RT2 line 36 is generated by retransmit circuit 30 This high pulse on RT2 line 36 is transmitted to counter 10 to enable each flip flop therein to receive a corresponding bit value from a respective write control line WQn. Since the address represented on WQ0–WQ8 is the address registered in the write counter, and since at this time the read counter has been reset to 0, the write counter address is equal to the difference between the write counter address and the read counter address. Therefore, up/down counter 10 is able to continue to correctly keep track of the difference between the read counter and the write counter.

Write counter lines WQ0–WQ8 are also directly fed into a preload decoder 44. Preload decoder 44 has a WE output 46, a WF output 48, and a WHF output 50. WE will be high responsive to WQ0–WQ8 being 000000001. Line 46 is connected to CEMPTY flag generator 16, and a CEMPTY flag will be generated responsive to a high signal on WE line 46 when a retransmit condition occurs.

WF line 48 is connected to CFULL flag generator 20. Responsive to WQ0–WQ8 inputting 111111111 into preload decoder 44, the signal on WF line 48 will be high. This in turn actuates flag generator 20 to generate a CFULL flag when a retransmit condition occurs.

WHF line 50 is connected to CHF flag generator 26. Responsive to WQ0–WQ8 inputting 100000000 into decoder 44, WHF line 50 will be high, actuating flag generator 26 to generate a CHF flag when a retransmit condition occurs.

As previously explained, up/down counter 10 increments or decrements responsive to signals on UPDN line 11 and read/write clock line 13. These lines in turn are outputs of an arbiter circuit 52. Arbiter circuit 52 receives as inputs a READ request line 54 and a WRITE request line 56. It also receives a master reset line 34. Arbiter circuit 52 determines the priority between conflicting read and write request signals received on lines 54 and 56. After determining the priority between the read and write operations, it will generate a clock pulse on WRCLK line 13 and the appropriate value on UPDN line 11. If read and write requests are received on lines 54 and 56 at close to the same time, arbiter 52 will actuate up/down counter 10 to first increment and then decrement, or vice versa, sequentially.

RT1 line 38 is input to each of flag generators 16, 20, and 26 and is used as a reset line. RT2 line 36 is input into generators 16, 20, and 26 and is used as a preload enable line, as will be further described in conjunction with FIG. 2 below.

The illustrated embodiment has an up/down counter 10 with nine bits B0-B8. It will be understood that the number of bits can be easily expanded or contracted without departing from the scope of the invention. Further, while three flag generators have been shown, less than these number of flags may be generated where the flags are not necessary, or other flags can be easily generated to represent any level of use of the FIFO capacity.

Figure 2:
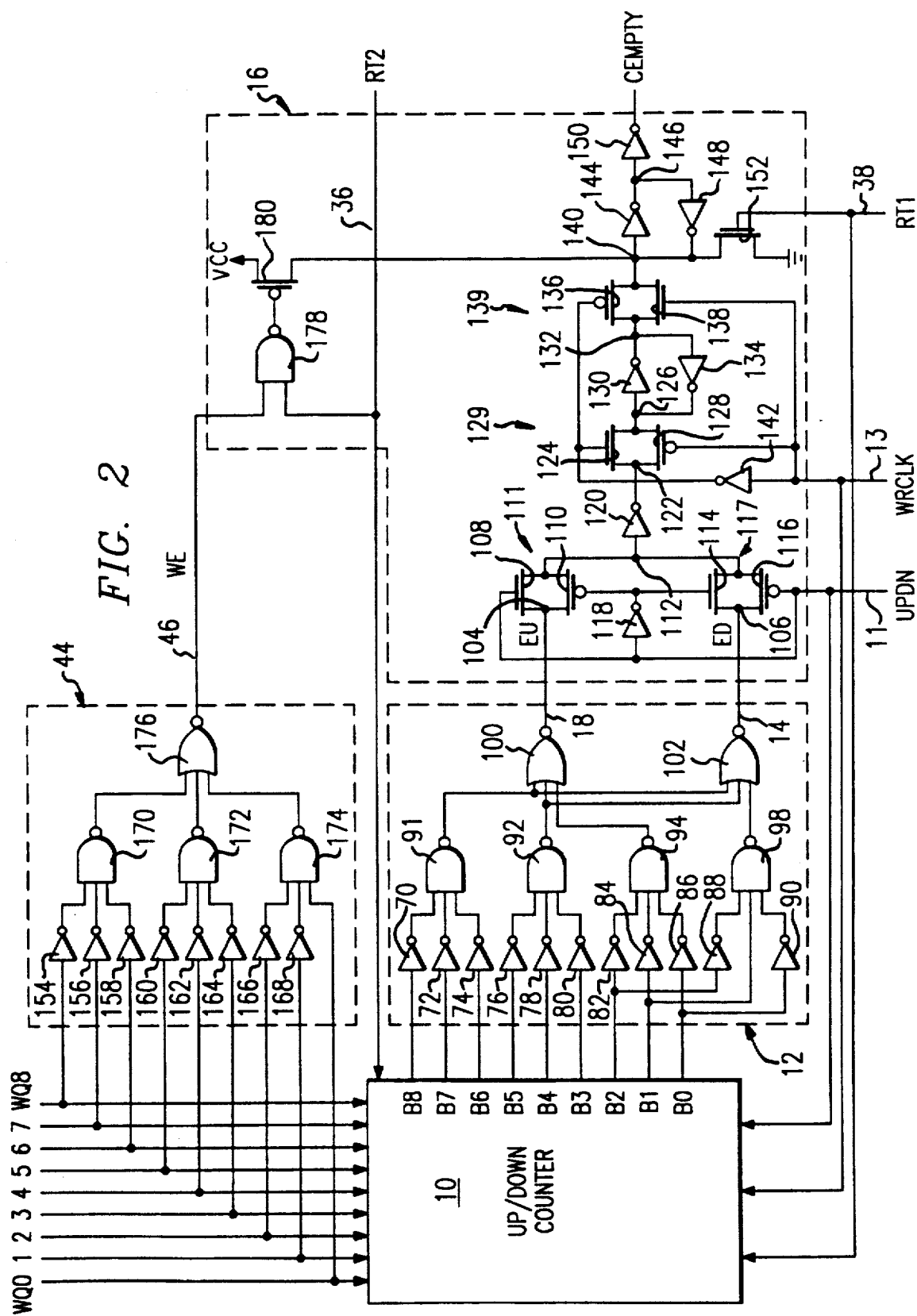
FIG. 2 is a more detailed schematic electrical diagram of a portion of the preload and flag generation circuitry shown in FIG. 1, particularly illustrating the look-ahead flag generator of the invention.

FIG. 2 is a detailed electric schematic diagram of a portion of the flag generator circuitry shown in FIG. 1. Dashed boxes enclose circuit blocks illustrated respectively in FIG. 1, such as the predecoder indicated generally at 12, the preload decoder indicated generally at 44, and the CEMPTY flag generator indicated generally at 16. In FIGS. 1 and 2, like numbers identify like parts wherever possible. FIG. 2 shows only the circuitry associated with CEMPTY flag generator 16, which has been segregated out from the generally similar circuitry used for the remaining flag generators 20 and 26 for purposes of clarity.

As previously described, up/down counter 10 stores the difference between the count stored in the read counter 220 and a write counter 210. This is normally performed by recording the pulses input on read/write clock signal line 13 in conjunction with up/down signal line 11. A nine-bit value representing the difference between the write and read counters is output on digit lines B0-B8. Lines B0-B8 are input into a plurality of inverters 70-86 within predecoder block 12. Line B0 is also connected to the input of an inverter 90. Line B2 is also connected to the input of an inverter 88. Inverters 70-74 have outputs connected to inputs of a NAND gate 91. Inverters 76-80 have outputs thereof connected to the inputs of a NAND gate 92. Inverters 82-86 have outputs thereof connected to the inputs of NAND gate 94. The outputs of inverters 88 and 90 are connected to a pair of inputs of NAND gate 98. The digit line B1 is connected directly to a third input of NAND gate 98.

The output of NAND gate 91 is connected to an input of a NOR gate 100 and further to an input of a NOR gate 102. The output of NAND gate 92 is likewise connected to a second input of NOR gate 100 and a second input of NOR gate 102. The output of NAND gate 94 is connected to a third input of NOR gate 100. The output of NAND gate 98 is connected to a third input of NOR gate 102.

The arrangement of inverters 70-90, NAND gates 91, 92, 94, and 98 and NOR gates 100 and 102 allows the decoding of a pair of selected boundary conditions. NOR gate 100 will output a high value responsive to digit lines B0-B8 inputting 000000000 or the EU boundary value. NOR gate 102 will output a high value responsive to digit lines B0-BS inputting 000000010 or the ED boundary value.

It is to be understood that while a predecoder section 12 has been shown for the decoding of nine bits, standard decoding principles can be applied for the decoding of an input address difference having more or less than 9 bits.

The output of NOR 100 is EU (empty up) output line 18. The output of NOR gate 102 is ED (empty down) line 14.

ED line 14 and EU line 18 are connected as inputs to the CEMPTY flag generator indicated generally at 16. EU line 18 is connected to an input node 104, while ED line 14 is connected to an input node 106. Node 104 is connected through the current path of an n-channel transistor 108 and through the current path of a p-channel transistor 110 to a node 112. Transistors 108 and 110 form a transfer gate 111. Similarly, node 106 is connected by an n-channel transistor 114 and by the current path of a p-channel transistor 116 to node 112. Transistors 114 and 116 form a transfer gate 117.

Up/down signal line 11 is input to the gates of transistors 116 and 108, and is inverted by inverter 118 and applied to the gates of transistors 114 and 110.

The signal appearing at node 112 is inverted by an inverter 120 and output to a node 122. Node 122 is connected through the current path of an n-channel transistor 124 to a latch node 126 and is also connected through the current path of a p-channel transistor 128 to a latch node 126. Transistors 124 and 128 form a transfer gate 129. Latch node 126 is connected to the input of a first inverter 130, the output of which is connected to another latch node 132. Latch node 132 is connected to an input of another inverter 134, the output of which is connected back to latch node 126. Latch node 132 is connected through the current path of a p-channel transistor 136 and through the current path of an n-channel transistor 138 to a flag signal output latch node 140. Transistors 136 and 138 form a transfer gate 139.

The read/write clock signal line 13 is connected directly to the gates of transistors 128 and 138 and is inverted by an inverter 142 and then applied to the gates of transistors 124 and 136.

A low value on read/write clock line 13 will actuate the transfer of a state present at node 122 to latch node 126. A high value present on read/write clock line 13 will actuate the transfer of the state present at latch node 132 to output latch node 140.

Latch node 140 is connected to the input of a latch inverter 144, the output of which is connected to a flag signal output latch node 146. Latch node 146 is connected to the input of an inverter 148, the output of which is connected back to latch node 140. The state at node 146 is inverted by an output inverter 150 and is output as the CEMPTY signal.

Reset line 38 is connected to the gate of a reset transistor 152. Reset transistor 152 is operable to connect latch node 140 to ground.

In preload decoder 44, write counter digit lines WQ1-WQ8 are input into respective ones of a set of inverters 154-168. The outputs of inverters 154-158 are input into a NAND gate 170. The outputs of inverters 160-164 are input into a NAND gate 172. The outputs of inverters 166 and 168 are input into a NAND gate 174. Write counter line WQ0 is input directly into NAND gate 174. The outputs of NAND gates 170, 172, and 174 are each input into a NOR gate 176. Gates 154-176 are operable to decode an input of 000000001 on write counter lines WQ0-WQ8 such that a high signal will appear on WE output line 46.

WE output line 46 is input to a preload enable NAND gate 178. RT2 line 36 is input into another input of NAND gate 178. The output of NAND gate 178 is connected to the gate of a p-channel transistor 180. A low state appearing at the gate of p-channel transistor 180 is operable to connect output latch node 140 to VCC, thereby storing a high state thereon.

In operation, the reset line 38 resets the outputs B0–B8 of up/down counter 10 to logic "O's". Responsive to a clock pulse on read/write clock line 13 and a high state on up/down line 11, counter 10 is incremented by one. Responsive to a clock pulse on clock line 13 and a low state on up/down line 11, counter 10 is decremented by one. A retransmit signal applied on RT2 line 36 enables up/down counter 10 to accept the current write address value on lines WQ0–WQ8, as previously explained in conjunction with FIG. 1.

The CEMPTY flag should be set high only when the up/down counter outputs B0–B8 are 000000001. Gates 70–102 are used to pre-decode this count. The output of NOR gate 100 is high when the counter is 000000000, which is one count before the count corresponding to the acuation of the CEMPTY flag (000000001). The output of NOR gate 102 is high when the counter outputs B0–B8 input 000000010, which is one count after the CEMPTY flag state.

If a write operation is indicated when the B0–B8 count is 000000000, both NOR gate output node 18 and up/down line 11 will be high. Therefore, gate 111 is activated to transmit the high state at node 18 to node 112. The pass gate 117 will be closed, preventing the transmission of any state at node 14 to node 112. The high state of node 112 is inverted to a low state at node 122 and is passed by the application of a low state on write clock 13 at the gates of transistors 124 and 128 to boundary signal latch node 126. This low state at node 126 is translated to a high state at latch node 132. When the next high state appears on read/write clock line 13, pass gate 129 will be disabled and pass gate 139 will be enabled, passing the high state stored at latch node 132 to flag signal output latch node 140. The high state at latch node 140 will be reflected as a low state at output latch node 146 and transmitted as a high state on the CEMPTY output flag.

Upon completion of the high clock pulse on read/write clock line 13, pass gate 129 is enabled and pass gate 139 is disabled. The states at node 140 and 146 and the high state of the CEMPTY flag remain unaffected.

A "count down" from 000000010 operates similarly. In this case, a high pulse on write/read clock 13, together with an appropriate value of the up/down signal on line 11, will cause up/down counter 10 to store 000000010. This value will be decoded as a high state on ED boundary signal line 14 and node 106. Responsive to the next read request signal, the up/down signal on line 11 will go low, indicating a read operation, before the transmission of a high pulse on read/write clock line 13. The low condition on the read/write clock line 13 causes pass gate 129 to be opened (rendered conductive) and pass gate 139 to be closed.

Therefore, when a low state on up/down signal line 11 occurs, the high state or boundary signal at node 106 will propagate through pass gate 117, inverter 120, pass gate 129, and latch inverter 130 until a high state is stored at boundary signal latch node 132. Then, a high pulse is received on read/write clock line 13. This closes pass gate 129, opens pass gate 139, and propagates the high state latched at node 132 through nodes 140 and 146 until a high state appears on the CEMPTY output line. Thus, the predecoder 16 is able to set up a trigger from a lower boundary value, such as 000000000 to 000000001, or can set up a trigger from a high boundary condition, such as 000000010 to 000000001. The boundary condition is stored until a count-up or a count-down signal is received, and this last signal is used to fire the flag at nearly the same time that the condition is being stored by counter 10.

The look-ahead generator also has a preload feature. As previously explained in connection with FIG. 1, a RETRAN signal actuates retransmit circuit 30 (FIG. 1) to first generate an RT1 signal on line 38, thereby clearing the flip flops (not shown) internal to up/down counter 10, and then generates an RT2 signal on line 36. The RT2 signal on line 36 enables the loading of the value on write counter inputs lines WQ0–WQ8 to be stored on these flip flops. Since the retransmit signal also sets the read counter to zero, the storage of the write counter value is equivalent to storing the difference between the write counter and the read counter, and therefore up/down counter 10 continues to accurately record the difference between these two counters.

Meanwhile, the write counter digits WQ0–WQ8 are input into inverters 154–168, with WQ0 being directly input into NAND gate 174. In the illustrated CEMPTY example, gates 154–176 decode 000000001 appearing on write counter lines WQ0–WQ8 to produce a high state on WE output line 46. A high state on output line 46 together with a high RT2 state appearing on line 36 causes NAND gate 178 to generate a low state, thereby actuating transistor 180 to pull up node 140 to VCC. The high state at node 140 is propagated through inverters 144 and 150 such that a high state on the CEMPTY flag output results.

The preload decoder indicated generally at 44 thus bypasses most of the circuitry to directly generate a CEMPTY flag. This is important because the flag generator normally requires the previous occurrence of a boundary condition in order to fire the CEMPTY flag. The previous occurrence of a boundary condition is not required during the retransmit phase of operation of the FIFO with which the flag generation circuitry of the invention is associated.

The look-ahead flag generator of the invention can also be applied to other sequential memories besides FIFO memories, such as last-in, first-out (LIFO) or stack memories. It is useful in any instance where flags need to be generated to indicate capacity conditions inside of a sequentially addressed memory.

In summary, a look-ahead flag generator has been disclosed that sets up the generation of a preselected flag responsive to the occurrence of either one of the boundary conditions on either side of a preselected value. In this way, at least three gate delays are saved in the generation of the flag. The flag generator of the invention further has a direct preload decoder feature that generates the desired status flag under a retransmit condition of operation of the associated memory.

While a preferred embodiment of the invention and its advantages have been described in the above detailed description, the invention is not limited thereto but only by the spirit and scope of the appended claims.

What is claimed is:

1. A look-ahead flag generator for generating a look-ahead flag signal when a predetermined value is stored in a counter, comprising:

a counter for storing any of a plurality of values, said values including said predetermined value and a boundary value displaced from said predetermined value by a unit of increment or decrement;

control signal means, coupled to said counter, for generating control signals to said counter causing a boundary value stored in said counter to be changed to said predetermined value;

a predecoder coupled to said counter for decoding said boundary value into a boundary signal;

a latch coupled to said predecoder for storing said boundary signal; and a signal generator coupled to said latch and said control signal means for generating said look-ahead flag signal in response to said control signals generated to said signal generator by said control signals means and in response to said boundary signal stored in said latch.

2. The look-ahead flag generator of claim 1, including:
   a value data source;
   a preload decoder coupled to said value data source for decoding a predetermined value from said value data source;
   a gate circuit coupled to said preload decoder for receiving said decoded predetermined value therefrom, an input of said gate circuit for receiving a preload signal, said gate circuit coupled to said signal generator for causing the generation of said look-ahead flag signal in response to said decoded predetermined value and said preload signal.

3. The look-ahead flag generator of claim 1, wherein said look-ahead flag signal indicates an empty condition in an associated sequential memory coupled to said look-ahead flag generator.

4. The look-ahead flag generator of claim 1, wherein said look-ahead flag signal indicates a full condition in an associated sequential memory, said memory being coupled to said value data source.

5. The look-ahead flag generator of claim 1, wherein said look-ahead flag signal indicates a half full condition in an associated sequential memory coupled to said look-ahead flag generator.

6. The look-ahead flag generator of claim 1 wherein said control signal means include a clock signal source for generating a clock signal coupled to said counter for actuating a decrement or an increment to a value stored in said counter, whereby said look-ahead flag signal is generated by the same clock signal that causes said boundary value stored in said counter to be changed to said predetermined value.

7. A look-ahead flag generator for generating a flag signal responsive to a storing of a predetermined value in a counter, comprising:
   an output of said counter for outputting any of a plurality of values, said values including said predetermined value and at least one boundary value that is one unit of increment or decrement removed from said predetermined value;
   a clock signal source, for generating a clock signal, coupled to said counter for actuating a decrement or an increment to a value stored in said counter;
   an up/down signal source coupled to said counter for producing an up/down signal indicating whether an increment or a decrement to said stored value is to be actuated, wherein predetermined states of said up/down signal and said clock signal cause a boundary value stored in said counter to be changed to said predetermined value;
   a predecoder coupled to said output of said counter for decoding said boundary value;
   a latch coupled to said predecoder for storing the decoded boundary value; and
   a gate circuit coupled to said latch, said up/down signal source, said clock signal source and further coupled to a flag signal output, said gate circuit for generating said flag signal to said flag signal output in response to said stored decoded boundary value and said predetermined states of said clock signal and said up/down signal.

8. The flag generator of claim 7, wherein
   a first predetermined state of said up/down signal and a predetermined state of said clock signal of said clock signal cause a first boundary value stored in said counter to be changed to said predetermined value;
   a second predetermined state of said up/down signal and a predetermined state of said clock signal cause a second boundary value stored in said counter to be changed to said predetermined value;
   said predecoder decodes either of said first and second boundary values, wherein said latch respectively stores either of said decoded first and second boundary values;
   said gate circuit generates said flag signal in response to said stored decoded first boundary value, said first predetermined state of said up/down signal, and said predetermined state of said clock signal, said gate circuit further generates said flag signal in response to said stored decoded second boundary value, said second predetermined state of said up/down signal, and said predetermined state of said clock signal.

9. A look-ahead flag generator for generating a sequential memory status flag in conjunction with a sequential memory having a predetermined portion of its capacity in use, said sequential memory having a read counter, coupled to said memory, for indicating a read address in said memory and a write counter, coupled to said memory, for indicating a write address in said memory, comprising:
   a counter, coupled to said read counter and to said write counter, for recording a difference between said read address and said write address, a multibit output of said counter for outputting a value of said difference;
   a predecoder coupled to said counter for decoding either a first or a second boundary value appearing on said multibit output, said first boundary value displaced one decrement unit from a predetermined difference value corresponding to said memory having said predetermined portion in use, said second boundary value one increment unit from said predetermined difference value;
   a clock signal source, producing a clock signal coupled to said counter for actuating an increment or a decrement of said difference,
   a read/write signal source coupled to said counter for generating a read/write signal indicating whether an increment or a decrement of said difference is to be actuated;
   a first gate circuit, coupled to said predecoder, to said read/write signal source, and to a boundary latch, for passing said decoded first boundary value to said boundary latch responsive to a first state of said read/write signal and for passing said decoded second boundary value to said boundary latch responsive to a second state of said read/write signal;

a second gate circuit for coupling said boundary latch to a status flag output latch, said second gate circuit for passing said decoded first and second boundary values from said boundary latch to said status flag output latch responsive to a first predetermined state of said clock signal; and an output of said status flag output latch outputting said status flag responsive to the passing of said decoded first and second boundary values by said second gate circuit, such that said status flag will be generated when said predetermined difference value is stored in said counter.

10. The flag generator of claim 9, and further comprising a third gate circuit for coupling an output of said first gate circuit to said boundary latch responsive to a second predetermined state of said clock signal opposite said first predetermined state of said clock signal.

11. The look-ahead flag generator of claim 9, and further comprising:

a preload decoder coupled to a value data source for receiving and decoding said predetermined difference value form said value data source;

a preload gate circuit for receiving said decoded predetermined difference value from said preload decoder and a preload signal, an output of said preload gate circuit coupled to said status flag output latch;

said preload gate circuit transmitting a status flag state to said status flag output latch in response to receiving said decoded predetermined difference value and said preload signal.

* * * * *